(12) United States Patent
Shyu et al.

(10) Patent No.: US 8,519,423 B2
(45) Date of Patent: Aug. 27, 2013

(54) CHIP

(75) Inventors: Chou-Ho Shyu, Hsinchu (TW); Yu-Ju Yang, Hsinchu (TW)

(73) Assignee: ILI Technology Corporation, Jhubei, Hsinchu County (TW)

( * ) Notice: Subject to any disclaimer, the term of this patent is extended or adjusted under 35 U.S.C. 154(b) by 0 days.

(21) Appl. No.: 13/495,978

(22) Filed: Jun. 13, 2012

(65) Prior Publication Data

US 2013/0105965 A1 May 2, 2013

(30) Foreign Application Priority Data

Oct. 26, 2011 (TW) .............................. 100138915 A

(51) Int. Cl.
*H01L 33/00* (2010.01)
(52) U.S. Cl.
USPC .................................... 257/98; 257/E33.076

(58) Field of Classification Search
USPC ...................................... 257/98, 103, E33.076
See application file for complete search history.

(56) References Cited

U.S. PATENT DOCUMENTS 7,071,495 B2 * 7/2006 Uemura ........................... 257/98

* cited by examiner

*Primary Examiner* — Quoc Hoang
(74) *Attorney, Agent, or Firm* — Kilpatrick Townsend & Stockton LLP

(57) ABSTRACT

A chip includes: a chip body; and a metal layer formed on the chip body, and including a metal interconnect region electrically connected to the chip body, a light trapping region, and a light reflective region that adjoins the light trapping region and that is able to reflect light. The light trapping region is formed with a plurality of gaps and has a plurality of metal members. Adjacent ones of the metal members are separated by the gaps. Each of the gaps is configured with a width in such a manner that most light irradiating the light trapping region will pass through the gaps and be trapped in the chip body so as to form brightness contrast between the light trapping region and the light reflective region.

8 Claims, 9 Drawing Sheets

CHIP

CROSS-REFERENCE TO RELATED APPLICATION

This application claims priority of Taiwanese Application No. 100138915, filed on Oct. 26, 2011, the disclosure of which is incorporated by reference herein.

BACKGROUND OF THE INVENTION

1. Field of the Invention

This invention relates to a chip, more particularly to a chip having a light trapping region and a light reflective region for position-alignment.

2. Description of the Related Art

A chip, which is made using processes for forming semiconductor integrated circuits, has a position-alignment region for subsequent processes, such that a poor yield rate due to misalignment can be prevented.

Referring to FIGS. 1 and 2, a conventional chip 1 includes a chip body 11, a metal layer 12 formed on the chip body 11, and a protective layer 13 formed on the metal layer 12.

The chip body 11 includes a plurality of predetermined metal interconnect circuits and integrated electrical elements. Since the structures of the circuits and electrical elements are well-known in the art, detailed descriptions thereof are omitted herein for the sake of brevity.

The metal layer 12 includes a metal interconnect region 121 and a position-alignment region 122. The metal interconnect region 121 cooperates with the chip body 11 to form a complete interconnect structure. After the subsequent packaging and wire-bonding processes, the operation of the chip 1 can be controlled by an external circuit. The position-alignment region 122 is a complete metal area and cooperates with the protective layer 13 to form a position-alignment pattern.

The protective layer 13 is patterned to have a through hole 131 to partially expose the position-alignment region 122. In detail, the protective layer 13 is formed over the metal layer 12 to have a predetermined thickness, and then, the through hole 131 is formed in a position corresponding to the position-alignment region 122 by a lithography process using a mask. Because the protective layer 13 and the position-alignment region 122 exposed from the protective layer 13 have different light reflection rates, brightness contrast is formed between the protective layer 13 and the position-alignment region 122 when light is irradiated thereto.

It should be noted that in order to form the brightness contrast for position alignment, the processes for forming and patterning the protective layer 13 are further required after the metal layer 12 is completely formed. Accordingly, the cost for forming the conventional chip is relatively high.

Besides, the protective layer 13 is made of titanium nitride (TiN), and the metal layer 12 is made of copper, aluminum, etc. The brightness contrast ratio between the protective layer 13 and the metal layer 12 is about 45 (see FIG. 9). Although the brightness contrast ratio of 45 is sufficient for position alignment, it is still low and further improvement is needed.

SUMMARY OF THE INVENTION

Therefore, an object of the present invention is to provide a chip that can overcome the aforesaid drawbacks associated with the prior art.

Accordingly, a chip of this invention comprises:

a chip body; and a metal layer formed on the chip body, and including a metal interconnect region electrically connected to the chip body, a light trapping region, and a light reflective region that adjoins the light trapping region and that is able to reflect light, the light trapping region being formed with a plurality of gaps and having a plurality of metal members, adjacent ones of the metal members being separated by the gaps, each of the gaps being configured with a width in such a manner that most light irradiating the light trapping region will pass through the gaps and be trapped in the chip body so as to form brightness contrast between the light trapping region and the light reflective region.

BRIEF DESCRIPTION OF THE DRAWINGS

Other features and advantages of the present invention will become apparent in the following detailed description of the preferred embodiments of the invention, with reference to the accompanying drawings, in which.

DETAILED DESCRIPTION OF THE PREFERRED EMBODIMENTS

Figure 1:
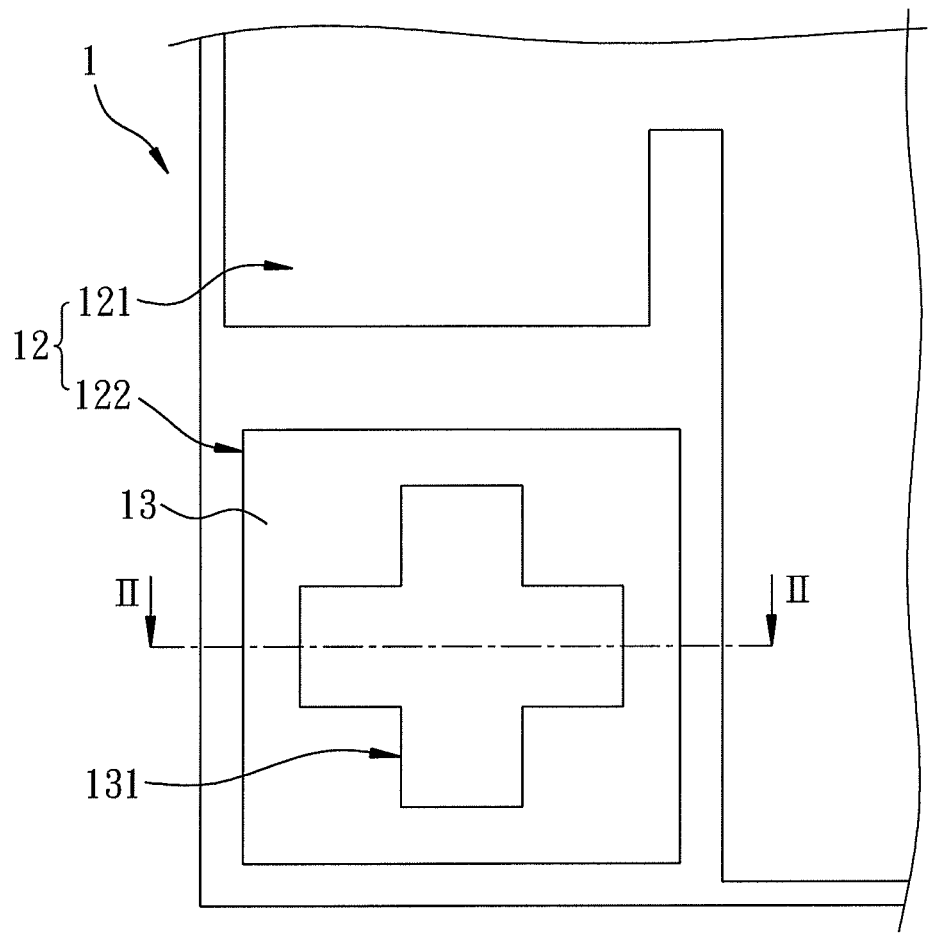
FIG. 1 is a fragmentary top view of a conventional chip.

Before the present invention is described in greater detail with reference to the accompanying preferred embodiments, it should be noted herein that like elements are denoted by the same reference numerals throughout the disclosure.

Figure 3:
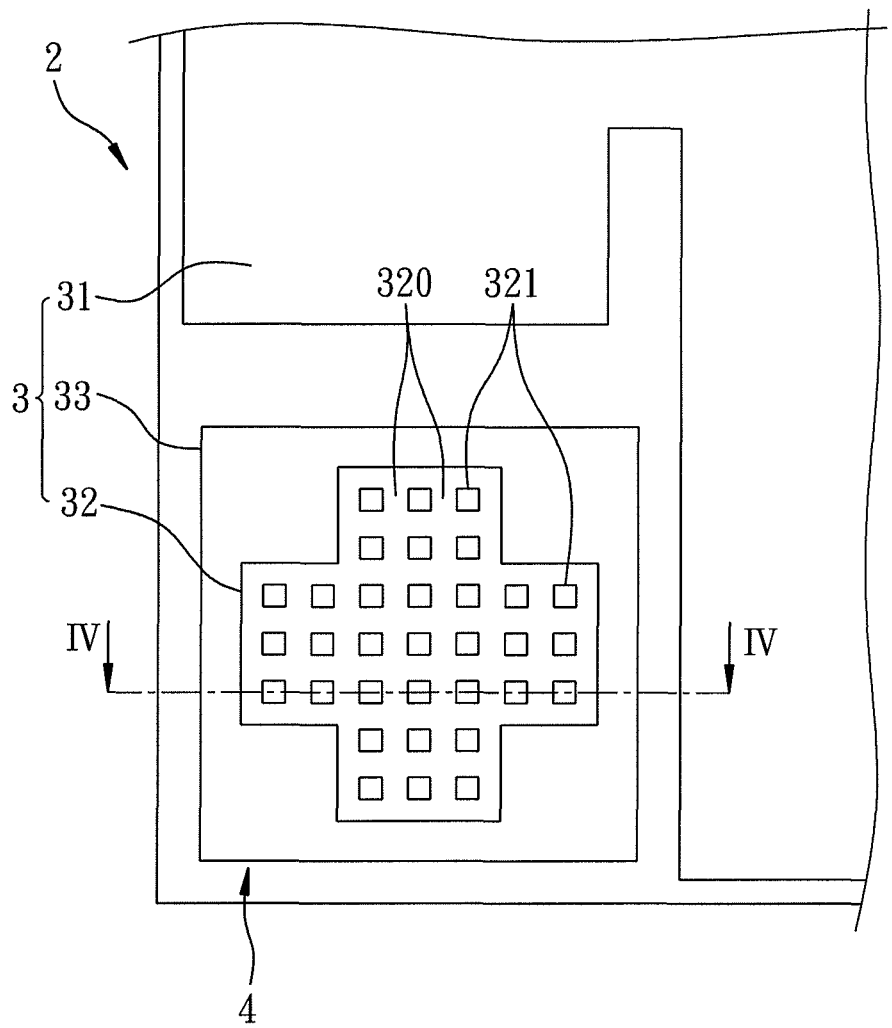
FIG. 3 is a fragmentary top view of the first preferred embodiment of a chip according to this invention.
Figure 4:
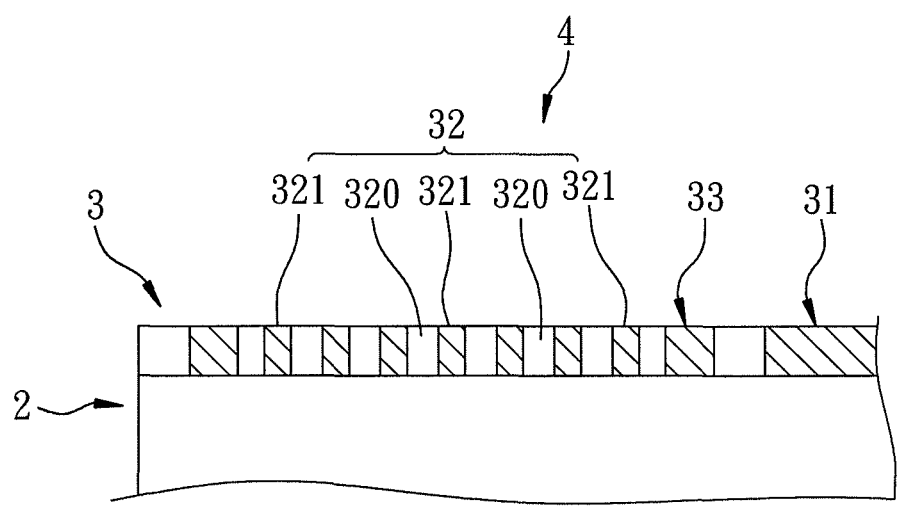
FIG. 4 is a fragmentary partly sectional view taken along line IV-IV in FIG. 3.

Referring to FIGS. 3 and 4, the first preferred embodiment of a chip according to this invention includes a chip body 2 and a metal layer 3 formed on the chip body 2.

The chip body 2 includes a plurality of predetermined metal interconnect circuits and integrated electrical elements. Since the circuits and the electrical elements are well-known in the art, detailed descriptions thereof are omitted herein for the sake of brevity.

The metal layer 3 includes a metal interconnect region 31, a light trapping region 32, and a light reflective region 33. The metal interconnect region 31 is electrically connected to the chip body 2 and cooperates with the chip body 2 to form a complete interconnect structure. After the subsequent packaging and wire-bonding processes, the operation of the chip can be controlled by an external circuit. The light trapping region 32 cooperates with the light reflective region 33 to form a position-alignment pattern 4. The light reflective region 33 is a complete metal area which surrounds and adjoins the light trapping region 32 and which can reflect most light irradiating the light reflective region 33. The light trapping region 32 is formed with a plurality of gaps 320 and has a plurality of metal members 321. Adjacent ones of the metal members 321 are separated by the gaps 320. Each of the gaps 320 is configured with a width in such a manner that most light irradiating the light trapping region 32 will pass through the gaps 320 and be trapped in the chip body 2 so as to form brightness contrast between the light trapping region 32 and the light reflective region 33. In the first preferred embodiment, the metal members 321 are arranged to form a cross shape.

In this embodiment, each of the metal members 321 has an upper surface that is in a rectangle shape and that is disposed opposite to the chip body 2. In order to obtain the position-alignment pattern 4 with a relatively high brightness contrast, each side of an outer periphery of each metal member 321 preferably has a length not greater than 100 μm, and the width of each of the gaps 320 preferably ranges from 0.1 μm to 100 μm.

Figure 5:
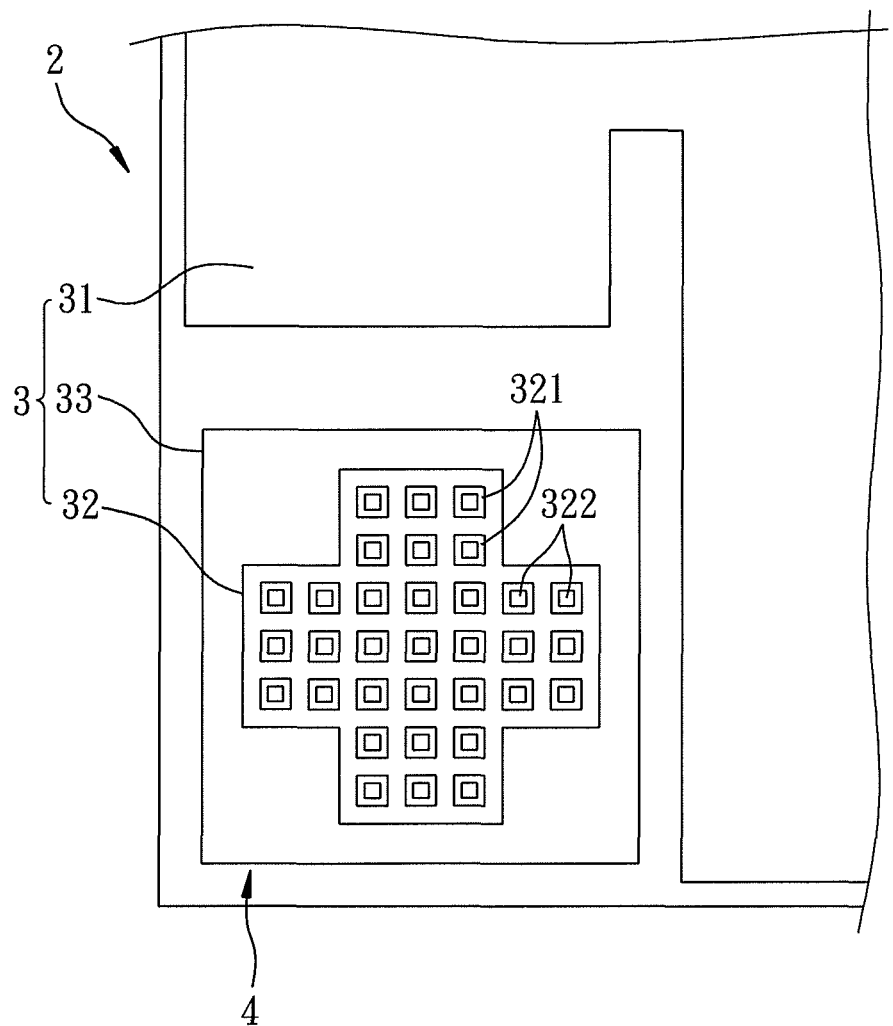
FIG. 5 is a fragmentary top view of a modified configuration of the first preferred embodiment of a chip according to this invention.

Referring to FIG. 5, in a modified configuration of the first preferred embodiment of the chip according to this invention, each of the metal members 321 has a through hole 322. Preferably, a distance between the center of each of the through holes 322 and an inner periphery of the corresponding one of the metal members 321 that defines the corresponding through hole 322 ranges from 0.05 μm to 25 μm. Preferably, the through hole 322 of each of the metal members 321 has a rectangular cross-section. A distance between the outer and inner peripheries of each of the metal members 321 is not greater than 50 μm. By virtue of the through holes 322 and the gaps 320, a relatively high percentage of light can be trapped in the chip body 2.

In order to stably produce the chip, the shapes and sizes of the gaps 320, the metal members 321 and the through holes 322 should be designed to meet parameters for lithography processes, machine performance, etc.

Figure 8:
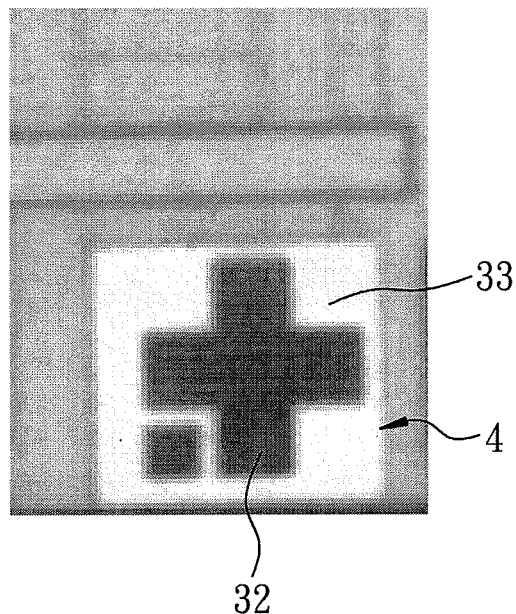
FIG. 8 shows brightness contrast ratio of the chip shown in FIG. 5.
Figure 9:
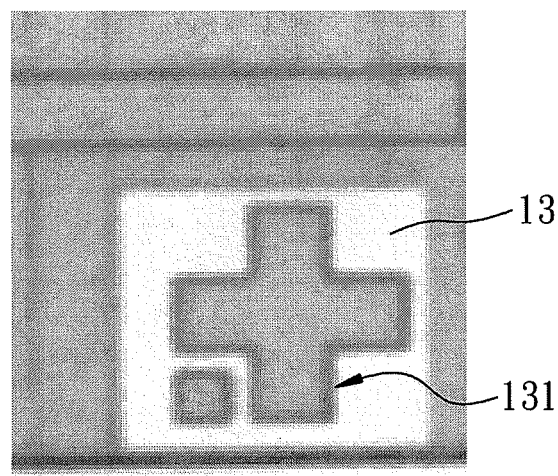
FIG. 9 shows brightness contrast ratio of the conventional chip in FIG. 1.

FIG. 8 is a fragmentary electron micrograph picture of the chip shown in FIG. 5. In the chip shown in FIG. 8, the upper surface of each of the metal members 321 has a square shape, and each of the through holes 322 has a square shape and is formed centrally in each of the metal members 321. Each side of the outer periphery of each of the metal members 321 has a length of about 2 μm. Each side of the inner periphery of each of the metal members 321 has a length of about 0.5 μm. Each of the gaps 320 is about 0.7 μm. In FIG. 8, since most of light that irradiates the light trapping region 32 passes through the gaps 320 and the through holes 322 and is thus trapped in the chip body 2, and since most of light that irradiates the light reflective region 33 is reflected by the light reflective region 33, the brightness contrast ratio (about 130~145) between the light trapping region 32 and the light reflective region 33 is superior to that of the conventional chip 1 (about 45, see FIG. 9).

Figure 6:
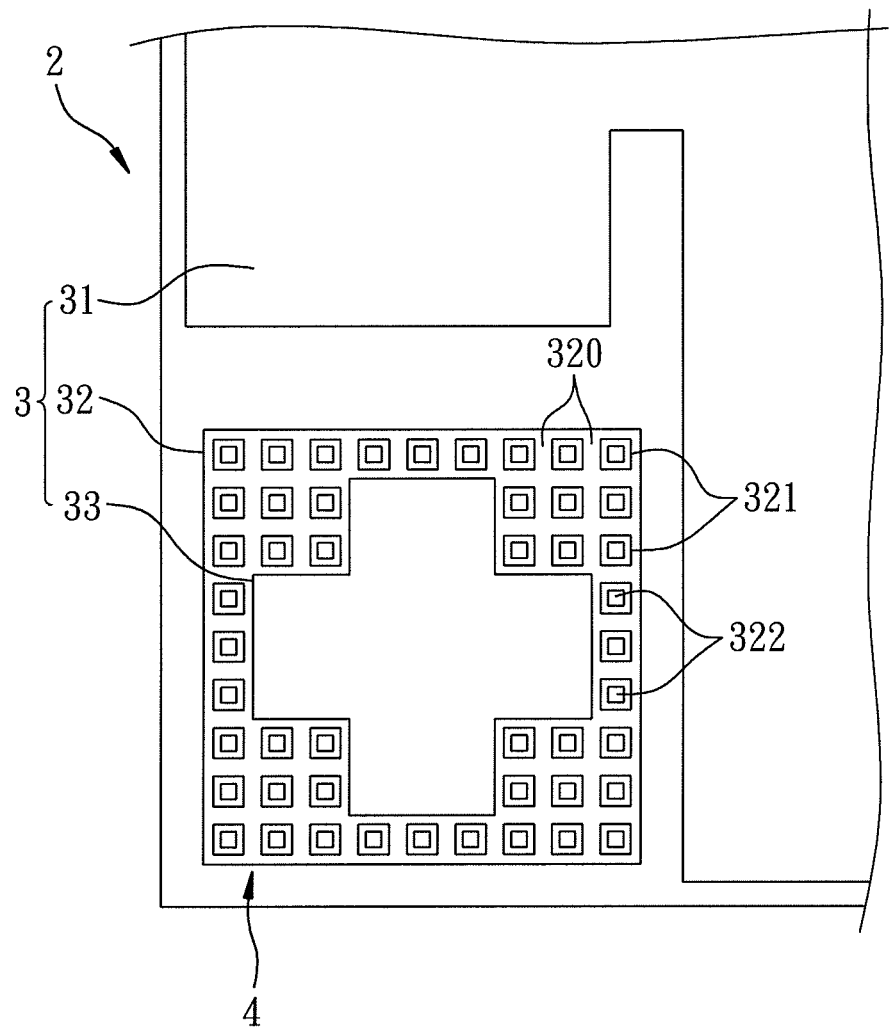
FIG. 6 is a fragmentary top view of another modified configuration of the first preferred embodiment of a chip according to this invention.

Referring to FIG. 6, in another modified configuration of the first preferred embodiment of the chip according to this invention, the locations of the light reflective region 33 and the light trapping region 32 are exchanged, i.e., the light reflective region 33 is a complete metal area that has a cross shape, and the light trapping region 32 adjoins and surrounds the light reflective region 33 and has metal members 321 having structures the same as that of the metal members 321 shown in FIG. 5.

Figure 2:
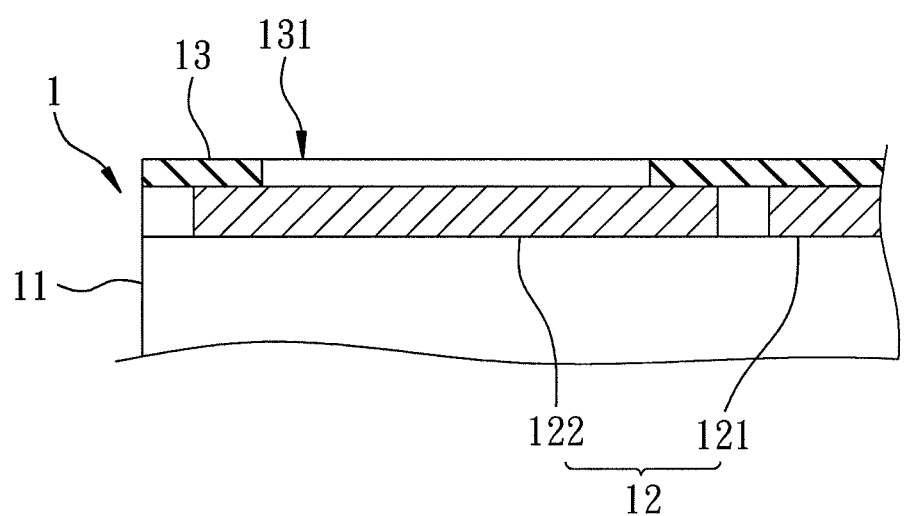
FIG. 2 is a fragmentary partly sectional view taken along line II-II in FIG. 1.

It is noted that the metal interconnect region 31 of the metal layer 3 is an essential structure of the chip of this invention. Since the position-alignment pattern 4 including the light trapping region 32 and the light reflective region 33 and the metal interconnect region 31 are formed from the same metal layer 3, while forming the metal interconnect region 31 using lithography processes, a mask used for forming the metal interconnect region 31 can be further designed to have a pattern corresponding to the position-alignment pattern 4 so that the position-alignment pattern 4 can also be formed during formation of the metal interconnect region 31. However, in the process of the conventional chip 1, after the metal interconnect region 121 of the conventional chip 1 (see FIGS. 1 and 2) is formed, in order to form the position-alignment pattern, additional processes for forming and patterning the protective layer 13 are necessary.

Accordingly, the chip of this invention not only has the position-alignment pattern 4 with better brightness contrast, but also can be produced in a relatively low cost and in a time-saving manner.

Figure 7:
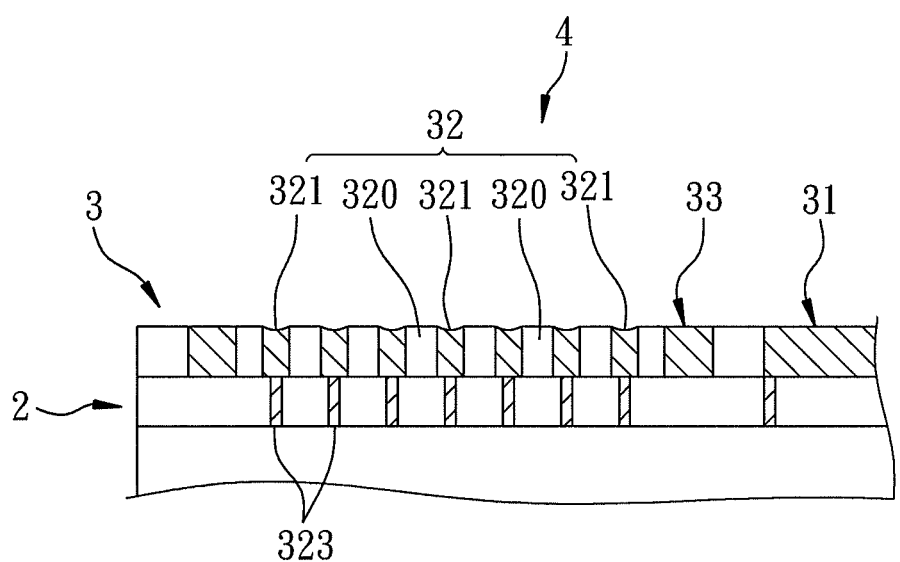
FIG. 7 is a fragmentary partly sectional view of the second preferred embodiment of a chip according to this invention.

FIG. 7 shows the second preferred embodiment of the chip according to this invention. The second preferred embodiment differs from the first preferred embodiment in that the second preferred embodiment of the chip further comprises a plurality of spaced apart metal pillars 323, each of which is connected between a respective one of the metal members 321 and the chip body 2. Each of the metal members 321 has an indented upper surface that is opposite to and indented toward the chip body 2.

With the metal pillars 323 disposed under the metal members 321, the light entering the gaps 320 will be reflected and scattered by the metal pillars 323, and can be efficiently trapped in the chip body 2. With the indented upper surface of each of the metal members 321, the light may be scattered or diffused thereby in a relatively high percentage. Accordingly, the brightness contrast between the light trapping region 32 and the light reflective region 33 is much more evident.

In the second preferred embodiment, the light trapping region 32, the light reflective region 33 and the metal members 321 can also be formed through design of a mask used in the lithography process of forming the metal interconnect region 31.

While the present invention has been described in connection with what are considered the most practical and preferred embodiments, it is understood that this invention is not limited to the disclosed embodiments but is intended to cover various arrangements included within the spirit and scope of the broadest interpretations and equivalent arrangements.

What is claimed is:

1. A chip comprising:
   a chip body; and
   a metal layer formed on said chip body, and including a metal interconnect region electrically connected to said chip body, a light trapping region, and a light reflective region that adjoins said light trapping region and that is able to reflect light, said light trapping region being formed with a plurality of gaps and having a plurality of metal members, adjacent ones of said metal members being separated by said gaps, each of said gaps being configured with a width in such a manner that most light irradiating said light trapping region will pass through said gaps and be trapped in said chip body so as to form brightness contrast between said light trapping region and said light reflective region.

2. The chip of claim 1, wherein the width of each of said gaps ranges from 0.1 μm to 100 μm.

3. The chip of claim 1, wherein said light trapping region is surrounded by said light reflective region.

4. The chip of claim 1, further comprising a plurality of spaced apart metal pillars, each of which is connected between a respective one of said metal members and said chip body.

5. The chip of claim 1, wherein each of said metal members has an indented upper surface opposite to said chip body.

6. The chip of claim 1, wherein each of said metal members has an upper surface that is in a rectangle shape and that is disposed opposite to said chip body, each side of an outer periphery of each of said metal members having a length not greater than 100 μm.

7. The chip of claim 6, wherein each of said metal members has a through hole, and an inner periphery that defines said through hole, a distance between a center of said through hole and said inner periphery ranging from 0.05 μm to 25 μm.

8. The chip of claim 7, wherein a distance between said outer and inner peripheries of each of said metal members is not greater than 50 μm.

* * * * *